United States Patent [19]

Yamada

[11] Patent Number: 5,132,762
[45] Date of Patent: Jul. 21, 1992

[54] SOLID STATE IMAGE SENSING DEVICE AND METHOD OF MANUFACTURING THE SAME

[75] Inventor: Tetsuo Yamada, Yokohama, Japan

[73] Assignee: Kabushiki Kaisha Toshiba, Kawasaki, Japan

[21] Appl. No.: 633,943

[22] Filed: Dec. 26, 1990

[30] Foreign Application Priority Data

Dec. 28, 1989 [JP] Japan .................................. 1-338412

[51] Int. Cl.⁵ ............................................ H01L 27/14
[52] U.S. Cl. ............................................ 357/30; 357/24
[58] Field of Search ................... 357/30, 30 H, 24 LR, 357/24

[56] References Cited

U.S. PATENT DOCUMENTS 4,618,874  10/1986  Yamada ................................. 357/30

FOREIGN PATENT DOCUMENTS

253330A2  1/1988  European Pat. Off. ..
WO89/09495  10/1989  Int'l Pat. Institute .
59-191378  10/1984  Japan .

Primary Examiner—Andrew J. James
Assistant Examiner—Courtney A. Bowers
Attorney, Agent, or Firm—Finnegan, Henderson, Farabow, Garrett and Dunner

[57] ABSTRACT

In a solid state image sensor device including photoelectric conversion elements and charge transfer devices, an impurity layer constituting a surface layer formed on each of the charge storage layers of the photoelectric conversion elements extends in the lateral direction of the semiconductor layer so that, when viewed from stop, an end of the surface impurity layer coincides with an end of a transfer electrode of each of the charge transfer devices and serves as an isolation layer, thereby obviating problems associated with the degradation of performance of the sensor device due to expansion of the isolation layer by thermal diffusion.

4 Claims, 4 Drawing Sheets

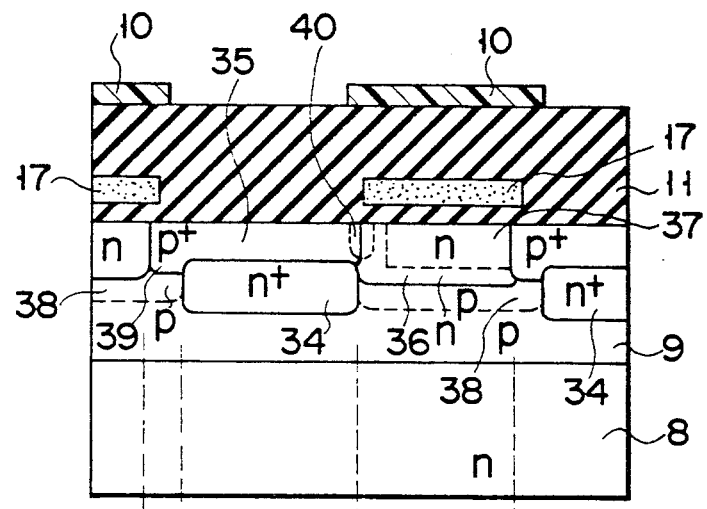
F I G. 6A
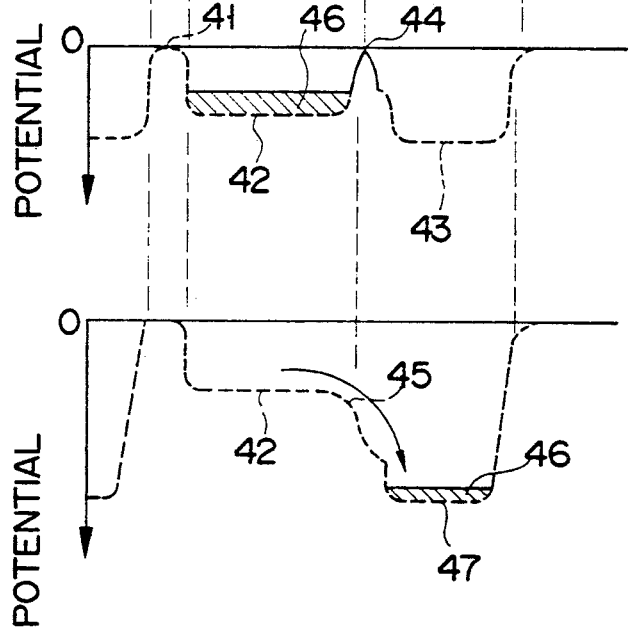
F I G. 6B
F I G. 6C

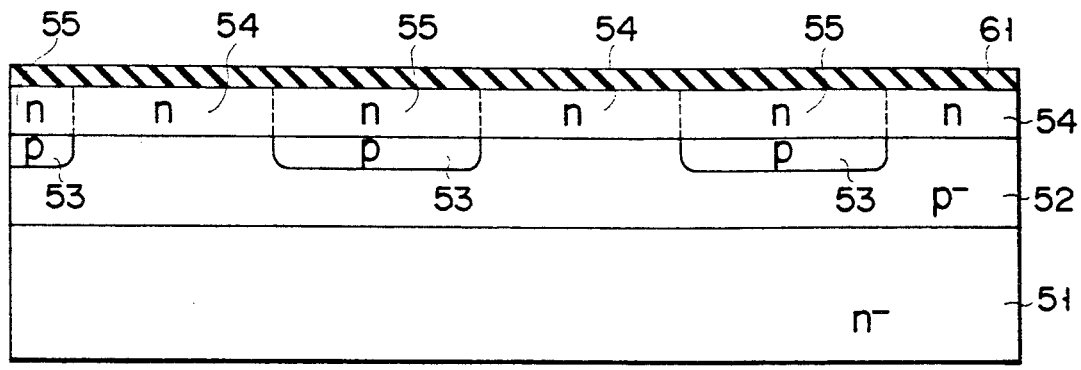
F I G. 7A
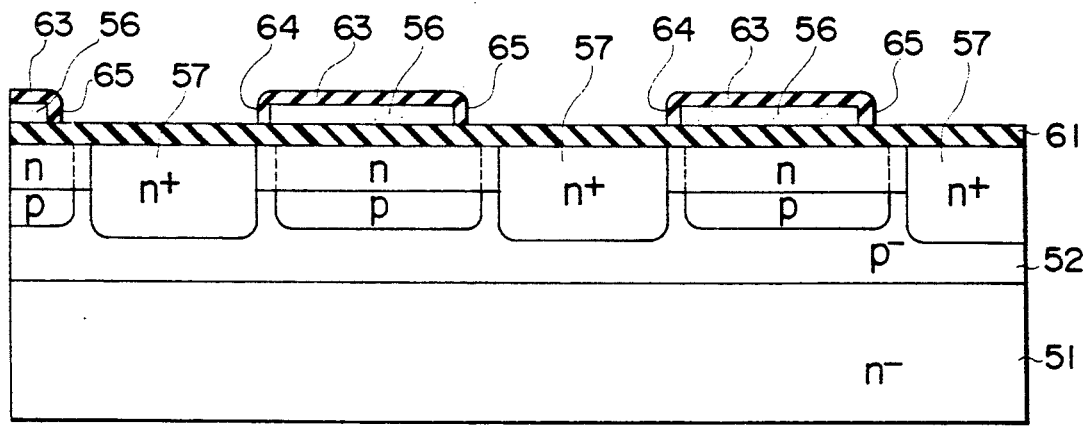
F I G. 7B
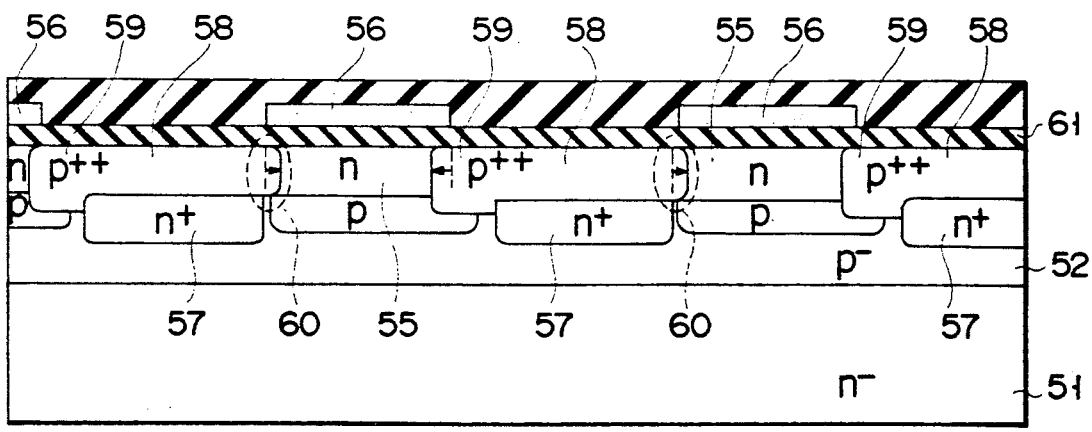
F I G. 7C

SOLID STATE IMAGE SENSING DEVICE AND METHOD OF MANUFACTURING THE SAME

BACKGROUND OF THE INVENTION

1. Field of the Invention

This invention relates to a solid state image sensing device and a method of manufacturing the device, and more particularly, to a highly integrated solid state image sensing device and a method of making such a device.

2. Description of the Related Art

A plan view of a part of a prior art solid state image sensing device is shown in FIG. 1, wherein reference numeral 1 is a first transfer electrode and 2 a second transfer electrode, which generally have a two layer structure of polysilicon layers, which in FIG. 1 are shown in the form of a single layer for the sake of brevity. The hatched areas 3 indicate isolation regions, 4 indicates a photoelectric conversion element and 5 indicates a charge transfer channel region. As an aid in understanding the structure, a cross section of the device taken along the line XII—XII of FIG. 1 is shown in FIG. 2. Each channel region 5 is generally formed of an N-type impurity layer and serves as a buried channel known in the art. The photoelectric conversion element 4 is in the form of a buried region formed by covering the surface of an N+ type impurity layer 7 with a P+ type impurity region 6. This arrangement permits the surface region of the N+ type impurity layer 7 to be maintained in a non-depleted state to render inactive carriers that are present in the interface. The significance of this is that the leak current is greatly decreased.

The isolation region 3 is formed of a P+ type impurity layer and electrically isolates the layer 7 from the layer 5 lying at one side thereof. No isolation layer 3 is formed, but a charge readout channel 15 is formed, between each layer 7 and layer 5 lying at the opposite side thereof. The charge readout channel 15 is controlled by the voltage of the electrode 2 and transfers signal charges (electrons) from the layer 7 to the layer 5.

Reference numeral 8 indicates an N type substrate, 9 a P type well layer, 10 light shield films for preventing image light from being incident to the charge transfer devices, and 11 an insulating film.

In the conventional structure, to ensure that the P+ layer 3 is positively overlapped with an end of each electrode 2, even when a masking deviation occurs in the manufacturing steps, an allowance of 0.5–1.0 μm in the lateral direction of the layer 3 is provided for compensating the deviation. Thus, the P+ layer 3 is formed prior to the formation of each electrode 2. Device performance, on the other hand, is determined by the abilities of the photoelectric conversion elements and the charge transfer devices, and is enhanced virtually in proportion to their areas lying in the horizontal plane. That is, the area of the P+ layer 7 needs to be increased to attain high sensitivity, and the N layer 5 needs to be broadened to implement a wide dynamic range (a large maximum amount of signal charge). It therefore is required that the isolation layer 3 be formed as narrow as possible in width. In forming the isolation layer 3, a P type impurity is implanted into a substrate by lithographic techniques using a resist pattern patterned to the most possible minimum size. The implanted impurity, however, is thermally diffused in a subsequent thermal step to cause the isolation layers 3 to occupy broad regions. For example, the P type layer formed with 1.0 μm width by use of a resist pattern of a 1.0 μm size is expanded for example to a 2.0 μm width after the heating step. The structure shown in FIGS. 1 and 2 requires the formation of P+ layers 3 at both sides of the photoelectric conversion element. If the above method is applied to the structure of FIG. 2, the width of the isolation layer 3 formed after the thermal step by a lithographic technique of a minimum width of 1.0 μm results in 2 μm required at each side of the conversion element and hence totally equals 4 μm. This is obviously against the goal of achieving high integration (a number of pixels) in the fabrication of solid state image sensors.

SUMMARY OF THE INVENTION

Accordingly, an object of the invention is to provide a solid state image sensor device of a new structure which removes the drawbacks associated with isolation layers according to the prior art technology, and a method of fabricating such a device.

According to this invention, a solid state image sensor device is provided which comprises: a plurality of photoelectric conversion elements and charge transfer devices for transferring signal charges stored in the photoelectric conversion elements, the photoelectric conversion elements including a plurality of charge storage impurity layers of a first conductivity type formed in a semiconductor body of a second conductivity type, and surface impurity layers of the second conductivity type formed in said semiconductor body, for covering surface portions of the charge storage impurity layers of the first conductivity type, and the charge transfer devices including a plurality of electrodes formed via an insulating film on those portions of the semiconductor body which are proximate each of the photoelectric conversion elements, wherein ends of the plurality of charge storage impurity layers of the photoelectric conversion elements and ends of the electrodes substantially coincide with each other partially, when viewed from top; and the surface impurity layers of the second conductivity type substantially coincide at substantially the entire of their ends with ends of the electrodes, when viewed from top, those portions of the surface impurity layers lying between the charge storage layers and the electrodes serving as isolation layers.

According to this invention, a method of manufacturing a solid state image sensor device is provided wherein charge storage layers are formed in a semiconductor body by ion implantation using transfer electrodes or insulating films covering the electrodes as portions of masks; and surface impurity layers covering the charge storage layers are formed by ion implantation using the electrodes or the insulating films covering the electrodes as a mask.

According to this invention, a method of manufacturing a solid state image sensor device is further provided wherein ends of surface impurity layers or charge storage layers are caused by thermal diffusion to extend from the ends of transfer electrodes toward semiconductor regions below the electrodes to form a potential barrier which creates a predetermined threshold voltage between the charge storage layers and the charge transfer devices.

More specifically, according to the invention, an impurity layer constituting a surface layer of a photoelectric convertion element in the solid state image sensor extends to a position corresponding to an end of a transfer electrode of each charge transfer device and the extended portion serves as an isolation layer, thereby obviating problems associated with the degradation of device performance due to expansion of the isolation layer in thermal diffusion. Further, the invention provides a method of making a solid state image sensor of a structure which is free of a drop of the gate threshold value of the charge readout channels due to short-channel effect, by utilizing an extension formed in the surface P type layer by thermal diffusion, and which is capable of avoiding layer deviations by using a self-alignment technique.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a sectional view of the solid state image sensing device according to a second embodiment of the present invention;

FIGS. 6B and 6C are views showing potential profile of the embodiment shown in FIG. 6A; and FIGS. 7A to 7C are views illustrating a method of making the device according to this invention.

DETAILED DESCRIPTION OF THE PREFERRED EMBODIMENTS

Figure 3:
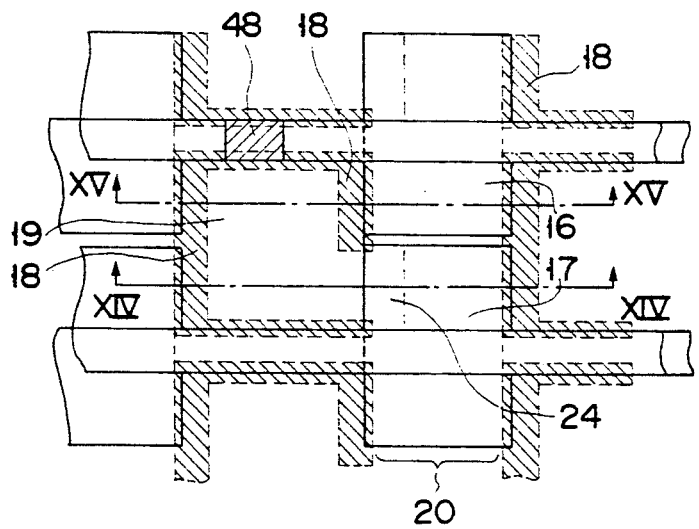
FIG. 3 is a plan view of a solid state image sensor device according to a first embodiment of the present invention.

A plan view of the essential parts of the solid state image sensor device according to a first embodiment of the present invention is illustrated in FIG. 3. The structure in cross section of the essential parts taken along the line XII—XII of FIG. 3 and a similar view taken along the line XV—XV are shown, respectively, in FIGS. 4 and 5. The illustrated embodiment includes elements contained in the conventional device referred to above, and corresponding parts are denoted by the same reference numerals. In FIG. 3, reference numerals 16 and 17 designate first and second transfer electrodes of the charge transfer device formed of a CCD (charge-coupled device), the hatched areas 18 designate isolation regions (isolation layers), the reference numeral 19 a photoelectric conversion element region, and 20 a transfer channel region (a channel layer).

The hatched area 48 represents a P type high concentration impurity layer for electrically coupling the isolation layers 18 (23 in FIGS. 4 and 5) separated by the electrodes, the layer 48 being formed prior to the formation of the electrodes. The P layer 48 becomes necessary where the concentration of the P well 9 is particularly low and the resistance between the elements is considerably high.

Figure 4:
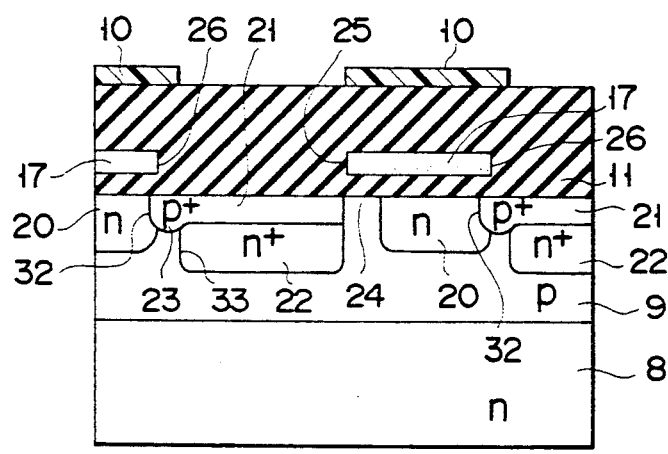
FIGS. 4 and 5 are sectional views of the device shown in FIG. 3.
Figure 5:
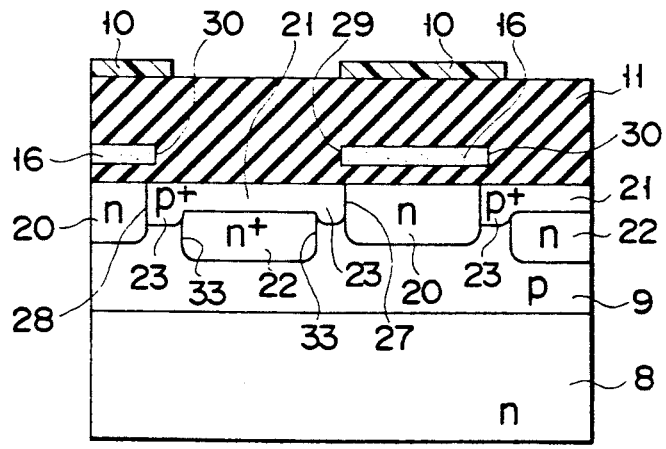

In FIGS. 4 and 5, numeral 8 indicates an N type substrate, 9 a P type well layer, 10 light shield films for preventing image light from being incident on the charge transfer devices, and 11 an insulating film.

As shown in FIGS. 4 and 5, the transfer channel region 20 is an N type charge transfer channel layer and reference numeral 21 represents a high concentration, P+ type impurity region overlying on the surface of a photoelectric conversion element, and including an extended portion 23. Reference numeral 22 denotes an N+ type impurity region constituting the body of the photoelectric conversion element a having photoelectric conversion function and a charge-storage function. Reference numeral 24 denotes a channel layer for reading a charge.

Figure 1:
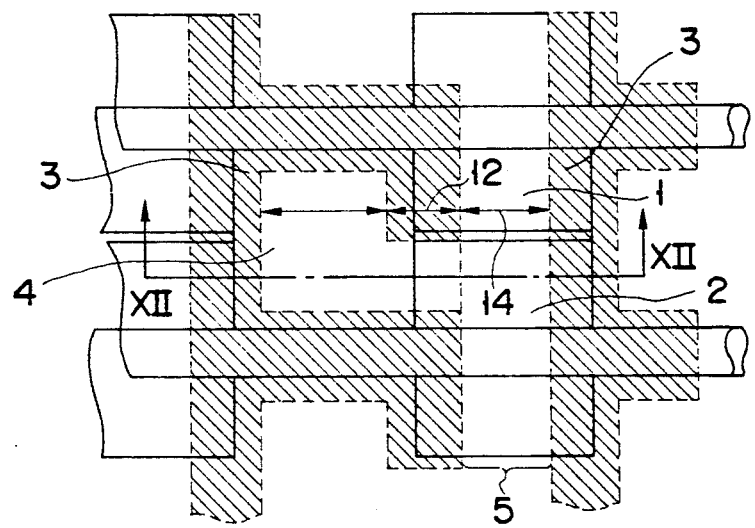
FIG. 1 is a plan view of a conventional solid state image sensor device.
Figure 2:
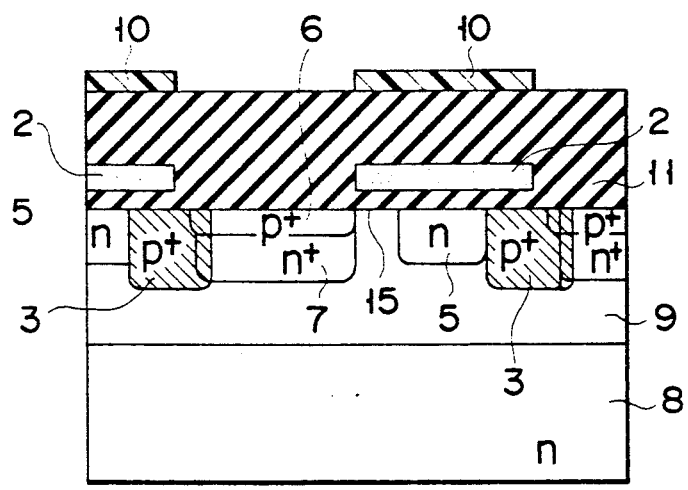
FIG. 2 is a sectional view of the device shown in FIG. 1.

In FIG. 4, the differences of the solid state image sensor device of this embodiment with the known device of FIG. 2 are in the absence of the isolation layer 3 according to this embodiment and in the presence, as an isolation layer, of the extended portion 23 of the impurity region 21 overlying the surface of the photoelectric conversion element 22. The forward end 32 of the extended portion 23 and a proximate end 26 of the second transfer electrode 17 approximately coincide with each other when viewed from top. In other words, they lie approximately in a single vertical plane. This structure can be readily realized, for example, by a self-alignment technique to be described later. Since the P+ type impurity region 23 defines the extended portion of the impurity region 21 overlying the N+ layer 22 to cover the surface area thereof and has a far shallower junction than at least the N+ layer 22, almost no reduction of the area of the N+ layer 22 due to impurity diffusion in the lateral direction from the P+ type impurity region 23 occurs. The result is that the width of the isolation layer 23 approximately equals the distance between its end 32 and the N layer 22 at its end 33 proximate to isolation layer 23. Accordingly, the minimum value of the width is determined by aligning precision during the manufacturing process of the electrode 17 and the N+ layer 22. Further, the forward end 32 of the extended portion 23 approximately coincides with to the proximate end of the transfer electrode 17 as viewed from top and extends no further making approximately equal the width of the charge transfer channel layer 20 and that of the electrode 17. In other words, the transfer channel width of the charge transfer device is defined by the ends of the surface impurity layer 21 which substantially coincide with the ends of the electrode when viewed from top. This permits the whole semiconductor region directly underneath the electrode 17 to function as the transfer channel, thus minimizing the size of an inactive region.

FIG. 5 shows a cross section taken along the line XV—XV of FIG. 3 in which the charge readout channel does not appear. The surface P+type layer 21 includes extended portions 23 at both ends, which serve as isolation layers and which has respective ends 27 and 28 that both approximately coincide with, respectively, the proximate ends 29 and 30 of the transfer electrodes 16 and 17, when viewed from top. The forward ends 27 and 28 of the extended portions 23 respectively define the proximate ends of the corresponding channel layers 20. As illustrated, the entire semiconductor region, except the extended portions 23, as viewed from top, provides for valid active regions for the photoelectric conversion element and the charge transfer device, thus greatly increasing device performance. The increased width of the photoelectric conversion layer 22 increases the amount of incident light to the solid state image sensor to increase its sensitivity. Increasing the width of the channel layer 20 as far as to the ends of the electrode 16 increases the amount of transferable charge per unit electrode width and hence broadens the dynamic range of the solid state image sensor.

As has been described, the width of the isolation layer 3 in the conventional device finally reaches to about 2.0 µm after a thermal treatment even when a lithographic technique providing a minimum manufacturing width of 1.0 µm is relied upon. In comparison, the structure according to a first embodiment of the present invention may attain a resulting width of the isolation layer 23 of about 0.5 to 1.0 µm even if a deviation of ±0.3 µm is taken into account between the left end 29 of the electrode 16 and the right end 33 of the photoelectric conversion layer 22, i.e., between the ends of the two elements closer to each other.

The structure, in cross section, of the solid state image sensor according to a second embodiment of the present invention is shown in FIG. 6A, wherein reference numeral 34 denotes an N+ type impurity layer forming a photoelectric conversion element, and 35 a P+ type impurity layer covering the layer 34, and 39 an extended portion of the layer 35, having an isolating function. Reference numeral 36 denotes an N type impurity layer, at least a major portion of which forms the charge transfer channel layer. The P+ type impurity layer 35 is formed in high impurity concentration and the impurity is diffused by thermal diffusion by being subjected to a thermal treatment step. By appropriately controlling the thermal treatment step, the P+ layer 35 may extend into the charge readout channel of the electrode 17 by a very short distance, the extended portion being denoted as 40. The extended portion 40 is in high concentration so that if the channel length is reduced, it may govern the channel threshold voltage. Potential distributions over the channel region ranging from the N+ layer 34 to the N layer 36 are shown in FIGS. 6B and 6C. Reference numeral 41 indicates the potential of the extended portion 39 of the P+ layer 35, which has an isolation function, the potential being fixed to a reference level. Reference numeral 42 shows the potential of the layer 34 in the state in which a signal charge has been read and the photoelectric conversion element 34 has been completely depleted, and reference numeral 43 (FIG. 6B) represents the potential of the charge transfer channel when the electrode 17 is at a low level and the N+ layer 34 and the N layer 36 are electrically separated from each other by a potential barrier formed therebetween. Reference numeral 44 is a readout channel potential which governs the threshold voltage of the read channel, which is brought about by the extended portion 40, and controlled by a potential applied to the electrode 17, which is in an off state in this instance. When the electrode 17 is set to a high potential level, the potential 44 is increased to potential 45 as shown in FIG. 6C to electrically couple the N+ layer 34 to the N layer 36, and a signal charge bundle 46 stored in the photoelectric conversion element 34 travels to the transfer channel 36. The formation and governing of the read channel by the extended portion 40 results in reducing the read channel length substantially to 1 µm or less, which heretofore has been required to be about 2 µm, for the prevention of short channel effect. This means that each width of the photoelectric conversion element and the charge transfer device is increased by that much, improving device performance, such as sensitivity and dynamic range. Reference numeral 37 in FIG. 6A indicates an additional impurity layer that is used when the concentration of the N layer 36 is insufficient for itself to function as the transfer channel. In this case, the potential distribution from potential 44 to 43 and from potential 45 to 47 appears in stepped fashion, as shown. 38 shows a P well for preventing the N layer 36 and the substrate 8 from punching through due to depletion of the P well 9. The well 38 is not an indispensable element.

An embodiment of a method of fabricating the device according to the present invention is shown in FIGS. 7A to 7C. While the method a illustrated is directed to making the solid state image sensing device according to the second embodiment as shown in FIGS. 6A to 6C, the method is applicable in principle to the fabrication of the device of the first embodiment.

In FIG. 7A, reference numeral 51 indicates an N⁻ type substrate, 52 a first P⁻ well, and 53 second P wells. Reference numeral 61 is an insulating film. After the formation of the P layers 52 and 53 on the N⁻ substrate 51 by ion implantation and thermal diffusion, N layers 54 and 55 are formed by ion implantation. While the N layers 54 and 55 are formed in the same ion implantation step, the layer formed in the first well 52 is indicated as an N layer 54 and those formed in the second P wells 53 as N layers 55 for the purpose of distinction. In fabricating the device according to the first embodiment, only the N layers 55 may be formed. Successively, a polycrystalline silicon electrode 56 is formed on the insulating film 61 in a confronting relationship with each of N layer 55, as shown in FIG. 7B, using polysilicon vapor deposition and selective etching processes, followed by the formation of an insulating film 63 on each electrode 56 by an oxidation step and a selective etching step, followed further by the formation of an N+ layer 57 by using partly a self-alignment technique using the insulating films 63 as a part of a mask (ion implantation inhibition layer) and by using an ion implantation step. One end of the N+ layers 57 is self-aligned with the left end 64 of each insulating film 63, and the other end thereof is defined by an end of a mask formed, for example, of a photoresist pattern (not shown). The photoresist mask in this instance extends further from the right end 65 of the insulating film 63 by a predetermined distance, whereby the other end of the N+ layer 57 is spaced apart from the right end 65 of the insulating film 63 by the above mentioned distance. High concentration P type layers 58 are then formed by a self-alignment technique in an ion implantation step using the insulating films 63 as a mask. A solid state image sensing device is manufactured finally after being subjected to a removal step for removing the insulating films 63, a thermal step for diffusing impurities, and vapor deposition and selective etching steps for forming wiring layers. The N layers 55 function as charge transfer channel layers in which both ends are defined by the P layers 58 and which correspond to the charge transfer channel layers 36 of FIG. 6A. The N+ layers 57 form photoelectric conversion elements which has surfaces covered by the P layers 58 and correspond to the N+ layer 34 of FIG. 6A. Of the P layers 58 P++ portions 59, extending leftwardly of the N+ layers, function as isolation layers and correspond to the extended portions 39 in FIG. 6A. The readout channel portions 60 (portions surrounded by broken lines in FIG. 7C) for reading a charge from the photoelectric conversion elements 57 to the transfer channel impurity layers 55 are formed by a thermal step by the diffusion in the lateral direction of the impurities from the P layers 58, to semiconductor regions under the electrodes so that potential barriers defining channel threshold voltages are formed between the charge storage layers and the charge transfer devices. The channel threshold voltage is controlled by the concentrations and junction lengths of the read out channel regions 60.

In the solid state image sensing device according to this invention, inactive regions created by the presence of the isolation P++ layers 59 can be decreased to a considerable extent, and further, a considerably large charge readout channel length (for example, 2 μm) which has been required for avoiding the short-channel effect may be reduced to the order of submicrons. This results in an increase in the areas of the photoelectric conversion elements and the charge transfer channel, thus providing for improvements in sensitivity and dynamic range. Thus, the present invention achieves minimum size elements and high integration.

The invention may be modified in various ways without being limited to the foregoing embodiments. For example, all indicated conductivity types of the elements may be reversed, in which case the potential relationship is also reversed. The substance of the method of fabrication resides in that the P++ type surface layers 58 are formed (self-aligned) using the electrodes surrounding the photoelectric conversion elements as a mask, that one end of the respective N+ layers 57 coincides with one end of one of the adjacent electrodes when viewed from top, and that the other end thereof is spaced apart with a fixed spacing from one end of the other of the adjacent electrodes. The other manufacturing steps described are not essential to the present invention.

As will be apparent from the foregoing description, the surface impurity layers of the photoelectric conversion elements according to this invention extend to the ends of the transfer electrodes for use as isolation layers, to obviate problems associated with degradation of device performance due to expansion of the isolation layers by thermal diffusion in the prior art device. Widening the surface impurity layers by thermal diffusion avoids lowering of the gate threshold value of the charge readout channels due to short-channel effect, and readily achieves high integration.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A solid state image sensor device comprising a plurality of photoelectric conversion elements and charge transfer devices for transferring signal charges stored in the photoelectric conversion elements, said photoelectric conversion elements including a plurality of charge storage impurity layers, with first and second ends, a first conductivity type formed in a semiconductor body of a second conductivity type, and surface impurity layers, with first and second ends, of the second conductivity type formed in said semiconductor body, for covering surface portions of the charge storage impurity layers, and said charge transfer devices including a plurality of charge transfer electrode, with first and second ends, for transferring signal charges stored in said charge storage impurity layers, formed via an insulating film on portions of said semiconductor body which are proximate the photoelectric conversion elements, wherein said first and second ends of said plurality of charge storage impurity layers and said first and second ends of said charge transfer electrodes partially coincide with each other, when viewed from above;

said first and second ends of said surface impurity layers substantially coincide with said first and second ends of the charge transfer electrodes, when viewed from above; and said second ends of said surface impurity layers are extended and form isolation regions between said charge storage impurity layers and said charge transfer electrodes.

2. The solid state image sensor device according to claim 1, wherein a potential barrier is formed where the ends of the charge transfer electrodes and the first and second ends of the charge storage layers substantially coincide with each other when viewed from above.

3. The solid state image sensor device according to claim 1, wherein said charge transfer devices are charge-coupled devices, and transfer channel widths thereof are defined by the first and second ends of said surface impurity layers which substantially coincide with the first and second ends of said charge transfer electrodes, when viewed from above.

4. The solid sate image sensor device according to claim 2, wherein said charge transfer devices are charge-coupled devices, and transfer channel widths thereof are defined by the first and second ends of said surface impurity layers which substantially coincide with the first and second ends of said charge transfer electrodes, when viewed from above.

* * * * *